United States Patent
Chen et al.

(10) Patent No.: US 8,274,072 B2
(45) Date of Patent: Sep. 25, 2012

(54) ULTRATHIN SPACER FORMATION FOR CARBON-BASED FET

(75) Inventors: Zhihong Chen, Valhalla, NY (US); Dechao Guo, Wappingers Falls, NY (US); Shu-jen Han, Cortlandt Manor, NY (US); Kai Zhao, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/401,967

(22) Filed: Feb. 22, 2012

(65) Prior Publication Data

US 2012/0146001 A1 Jun. 14, 2012

Related U.S. Application Data

(62) Division of application No. 12/826,221, filed on Jun. 29, 2010.

(51) Int. Cl.
  *H01L 29/76* (2006.01)

(52) U.S. Cl. ..... 257/27; 257/29; 257/365; 257/E21.395; 257/E29.255

(58) Field of Classification Search ............... 257/24, 257/77, 314, 347, 365, 757, 410–411; 438/105, 438/301, 585, 643
See application file for complete search history.

(56) References Cited

U.S. PATENT DOCUMENTS

| 4,389,973 | A | 6/1983 | Suntola et al. |
| 6,620,670 | B2 | 9/2003 | Song et al. |
| 7,005,333 | B2 * | 2/2006 | Li ......................... 438/172 |
| 7,402,534 | B2 | 7/2008 | Mahajani |
| 2004/0224490 | A1 | 11/2004 | Wei et al. |
| 2006/0118777 | A1 | 6/2006 | Hirakata et al. |
| 2006/0258174 | A1 | 11/2006 | Sakai et al. |
| 2007/0102747 | A1 | 5/2007 | Chen et al. |
| 2007/0218600 | A1 * | 9/2007 | Deleonibus ................ 438/151 |
| 2009/0291534 | A1 | 11/2009 | Li et al. |

OTHER PUBLICATIONS

B. Lee et al., Conformal Al2O3 dielectric layer deposited by atomic layer deposition for graphene-based nanoelectronics, Applied Physics Letters, vol. 92, 2008, pp. 203102-1-203102-3.
T. Seyller et al., Electronic properties of SiC surfaces and interfaces: some fundamental and technological aspects, Applied Physics A, vol. 85, 2006, pp. 371-385.
J. Kim et al., Initial surface reactionsof atomic layer deposition, JOM Journal of the Minerals, Metals, and Materials Society, vol. 61, No. 6, Jun. 2009, pp. 17-22.
Notice of Allowance dated Feb. 1, 2012; U.S. Appl. No. 12/826,221, filed Jun. 29, 2010; Confirmation No. 3003.

* cited by examiner

*Primary Examiner* — Dung A. Le
(74) *Attorney, Agent, or Firm* — Cantor Colburn LLP; Vazken Alexanian

(57) ABSTRACT

A carbon-based field effect transistor (FET) includes a substrate; a carbon layer located on the substrate, the carbon layer comprising a channel region, and source and drain regions located on either side of the channel region; a gate electrode located on the channel region in the carbon layer, the gate electrode comprising a first dielectric layer, a gate metal layer located on the first dielectric layer, and a nitride layer located on the gate metal layer; and a spacer comprising a second dielectric layer located adjacent to the gate electrode, wherein the spacer is not located on the carbon layer.

16 Claims, 8 Drawing Sheets

ULTRATHIN SPACER FORMATION FOR CARBON-BASED FET

CROSS-REFERENCE TO RELATED APPLICATION

This application is a divisional of U.S. application Ser. No. 12/826,221, filed on Jun. 29, 2010.

FIELD

This disclosure relates generally to the field of semiconductor device fabrication, and more specifically to formation of an ultrathin spacer for a carbon-based field effect transistor (FET) device.

DESCRIPTION OF RELATED ART

In modern microelectronic integrated circuit (IC) technology, a silicon wafer is lithographically patterned to accommodate a large number of interconnected electronic components (such as FETs, resistors, or capacitors, etc.). The technology relies on the semiconducting properties of silicon and on lithographic patterning methods. Increasing the density of electronic components and reducing the power consumption per component are two major objectives in the microelectronics industry, which have driven the steady reduction in the size of components in past decades. However, miniaturization of silicon-based electronics may reach a limit in the near future, primarily because of limitations imposed by the material properties of silicon and doped silicon at the nanoscale level.

To sustain the miniaturization trend in microelectronics beyond the limits imposed by silicon-based microelectronics technologies, alternative technologies and materials need to be developed. Requirements for such alternative technologies include smaller feature sizes than are feasible with silicon-based microelectronics, more energy-efficient electronic strategies, and production processes that allow large-scale integration, preferably using lithographic patterning methods related to those used in silicon-based microelectronic fabrication. A material that is being explored as an alternative to silicon in microelectronics fabrication is carbon. The carbon used for such applications may take various forms, including graphene. Graphene refers to a two-dimensional planar sheet of carbon atoms arranged in a hexagonal benzene-ring structure. A free-standing graphene structure is theoretically stable only in a two-dimensional space, which implies that a truly planar graphene structure does not exist in a three-dimensional space, being unstable with respect to formation of curved structures such as soot, fullerenes, nanotubes or buckled two dimensional structures. However, a two-dimensional graphene structure may be stable when supported on a substrate, for example, on the surface of a silicon carbide (SiC) crystal. Free standing graphene films have also been produced, but they may not have the idealized flat geometry.

Structurally, graphene has hybrid orbitals formed by $sp^2$ hybridization. In the $sp^2$ hybridization, the 2s orbital and two of the three 2p orbitals mix to form three $sp^2$ orbitals. The one remaining p-orbital forms a pi ($\pi$)-bond between the carbon atoms. Similar to the structure of benzene, the structure of graphene has a conjugated ring of the p-orbitals, i.e., the graphene structure is aromatic. Unlike other allotropes of carbon such as diamond, amorphous carbon, carbon nano foam, or fullerenes, graphene is only one atomic layer thin.

Graphene has an unusual band structure in which conical electron and hole pockets meet only at the K-points of the Brillouin zone in momentum space. The energy of the charge carriers, i.e., electrons or holes, has a linear dependence on the momentum of the carriers. As a consequence, the carriers behave as relativistic Dirac-Fermions with a zero effective mass and are governed by Dirac's equation. Graphene sheets may have a large carrier mobility of greater than 200,000 $cm^2$/V-sec at 4K. Even at 300K, the carrier mobility can be as high as 15,000 $cm^2$N-sec.

Graphene layers may be grown by solid-state graphitization, i.e., by sublimating silicon atoms from a surface of a silicon carbide crystal, such as the (0001) surface. At about 1,150° C., a complex pattern of surface reconstruction begins to appear at an initial stage of graphitization. Typically, a higher temperature is needed to form a graphene layer. Graphene layers on another material are also known in the art. For example, single or several layers of graphene may be formed on a metal surface, such as copper and nickel, by chemical deposition of carbon atoms from a carbon-rich precursor.

Graphene displays many other advantageous electrical properties such as electronic coherence at near room temperature and quantum interference effects. Ballistic transport properties in small scale structures are also expected in graphene layers. Graphene may form a one-atom thick planar sheet of carbon, referred to as a graphene sheet; graphite, which comprises stacks of graphene sheets; or a carbon nanotube.

A carbon-based FET may comprise a form of graphene in the channel and source/drain regions. However, one issue in forming carbon-based FET devices is that spacer formation may be difficult. FET spacers may be formed by depositing the spacer material, and then performing reactive ion etching (RIE) to shape the spacers. However, in a carbon-based FET, the RIE may damage the graphene in the source/drain and channel regions, making this method of spacer formation impractical for carbon-based FETs.

SUMMARY

In one aspect, a carbon-based field effect transistor (FET) includes a substrate; a carbon layer located on the substrate, the carbon layer comprising a channel region, and source and drain regions located on either side of the channel region; a gate electrode located on the channel region in the carbon layer, the gate electrode comprising a first dielectric layer, a gate metal layer located on the first dielectric layer, and a nitride layer located on the gate metal layer; and a spacer comprising a second dielectric layer located adjacent to the gate electrode, wherein the spacer is not located on the carbon layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of an ultrathin spacer for a carbon-based FET, and a method of forming an ultrathin spacer for a carbon-based FET, are provided, with exemplary embodiments being discussed below in detail. Selective deposition using atomic layer deposition (ALD) may be used to deposit spacer material for a carbon-based FET, allowing precise spacer thickness control, anywhere in the range from about 10 angstroms to about 100 nanometers or greater. Reduction in spacer thickness may significantly improve FET parasitic resistance by reducing the underlap region between the gate and source/drain regions. A carbon FET may comprise one or more graphene sheets or carbon nanotubes in the channel and source/drain regions.

Figure 1:
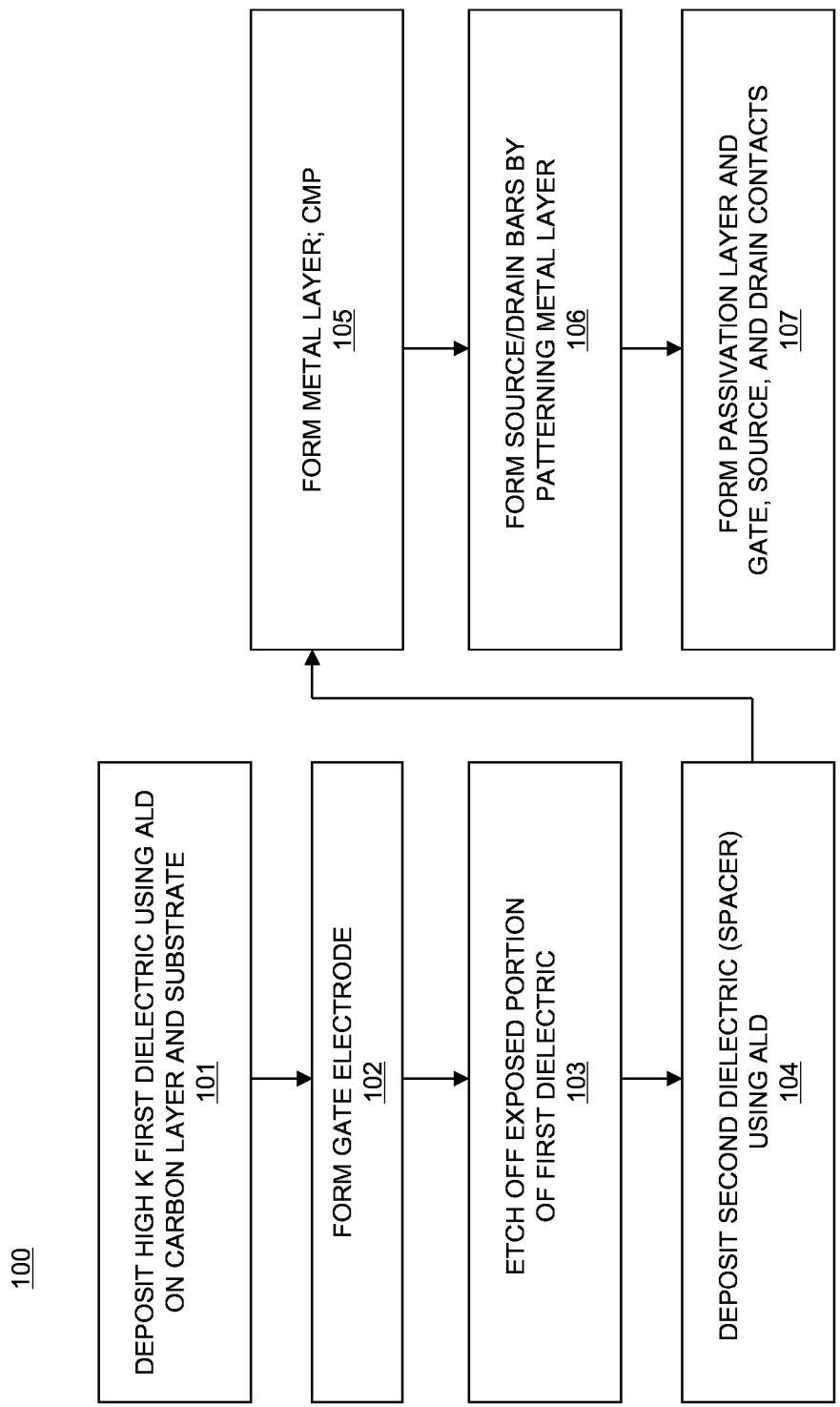
FIG. 1 illustrates an embodiment of a method of forming an ultrathin spacer for a carbon FET.
Figure 2:
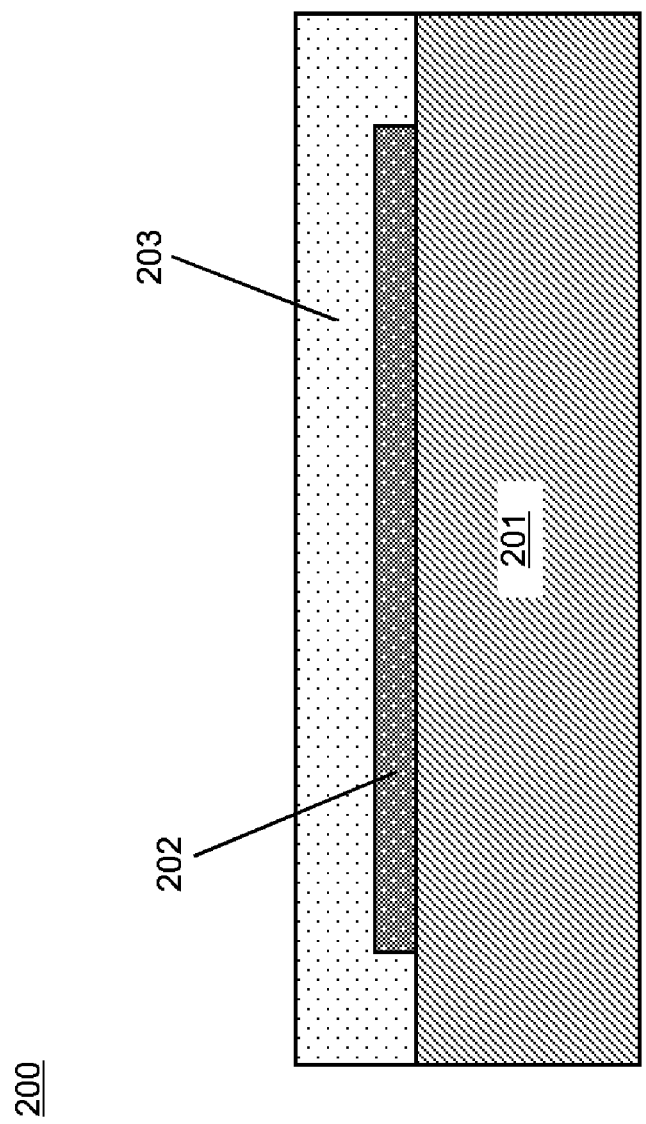
FIG. 2 illustrates an embodiment of a cross section of a first dielectric deposited on a carbon layer on a substrate.

FIG. 1 illustrates an embodiment of a method 100 of forming an ultrathin spacer for a carbon FET. FIG. 1 is discussed with reference to FIGS. 2-8. In block 101, a first dielectric 203 is deposited using ALD over substrate 201 and carbon layer 202, as shown in the cross section 200 of FIG. 2. Substrate 201 may comprise oxide in some embodiments. Carbon layer 202 may comprise one or more graphene sheets or carbon nanotubes in various embodiments. First dielectric 203 comprises a high k material, and may be formed by first depositing a seed layer, and the depositing the high k material over the seed layer using ALD. The seed layer is selected to promote adhesion of the first dielectric 203 to carbon layer 202, and may comprise aluminum or a polymer such as a nanofibrillar composite (NFC) in some embodiments. Alternately, the top surface of carbon layer 202 maybe treated with ozone ($O_3$) before ALD of high k first dielectric 203. The high k material comprising first dielectric 203 may comprise any appropriate high k material, including but not limited so hafnium oxide ($HfO_2$) or aluminum oxide ($Al_2O_3$).

Figure 3:
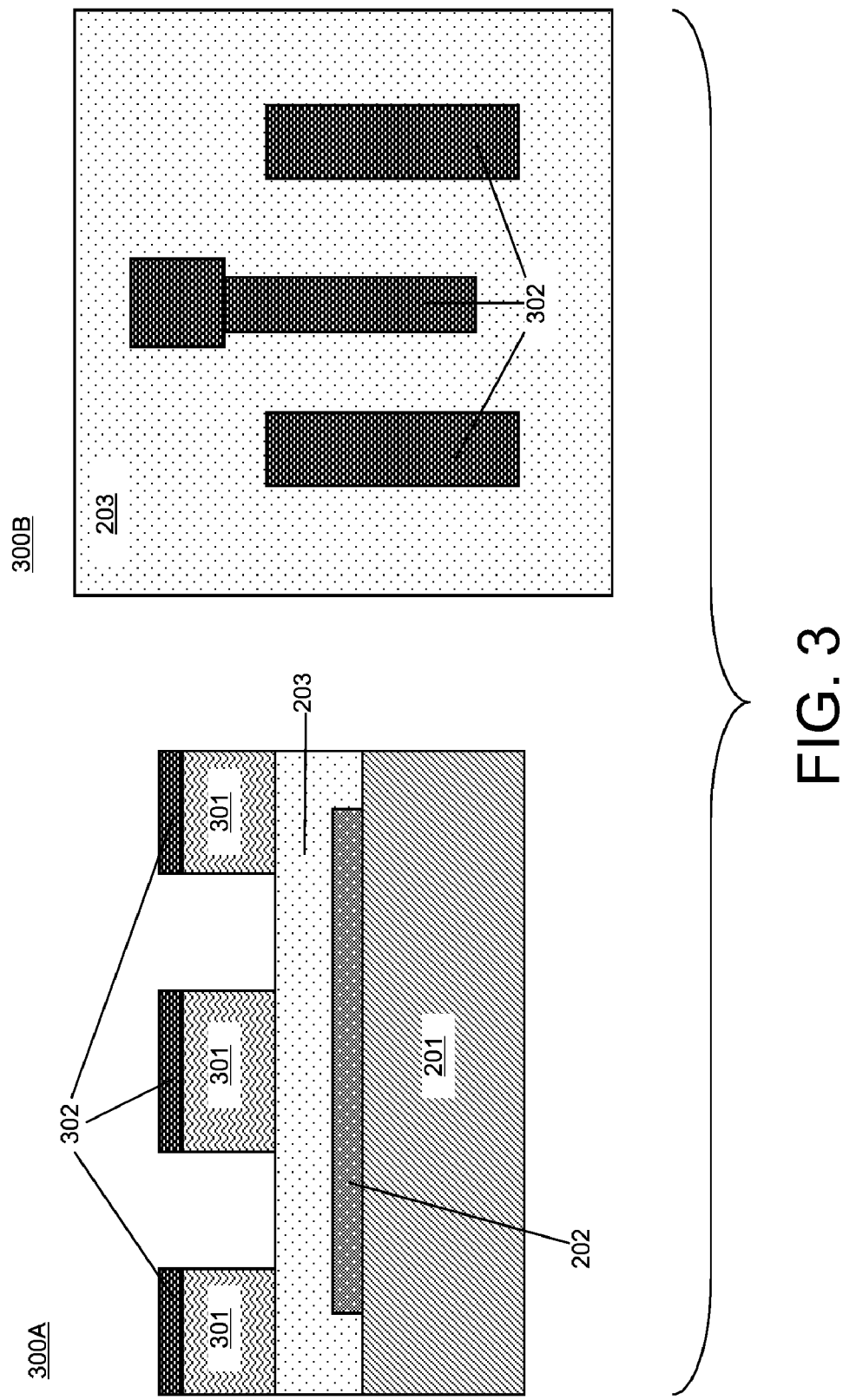
FIG. 3 illustrates an embodiment of a cross section and a top view of the device of FIG. 2 after gate electrode formation.

In block 102, gate electrodes comprising gate metal 301 under nitride layers 302 are formed on first dielectric 203, as shown in FIG. 3. FIG. 3 illustrates an embodiment of a cross section 300A and a top view 300B of the device of FIG. 2 after gate electrode formation. The gate metal 301 and nitride layers 302 may be formed by lift-off patterning in some embodiments, or by deposition and etching in other embodiments. Gate metal 301 may comprise palladium in embodiments in which a p-type carbon FET is being formed, or may comprise aluminum in embodiments in which an n-type carbon FET is being formed. The thickness of gate metal 301 may be adjusted as needed to obtain an optimal gate-to-source/drain capacitance and source/drain underlap resistance in the finished carbon-based FET.

Figure 4:
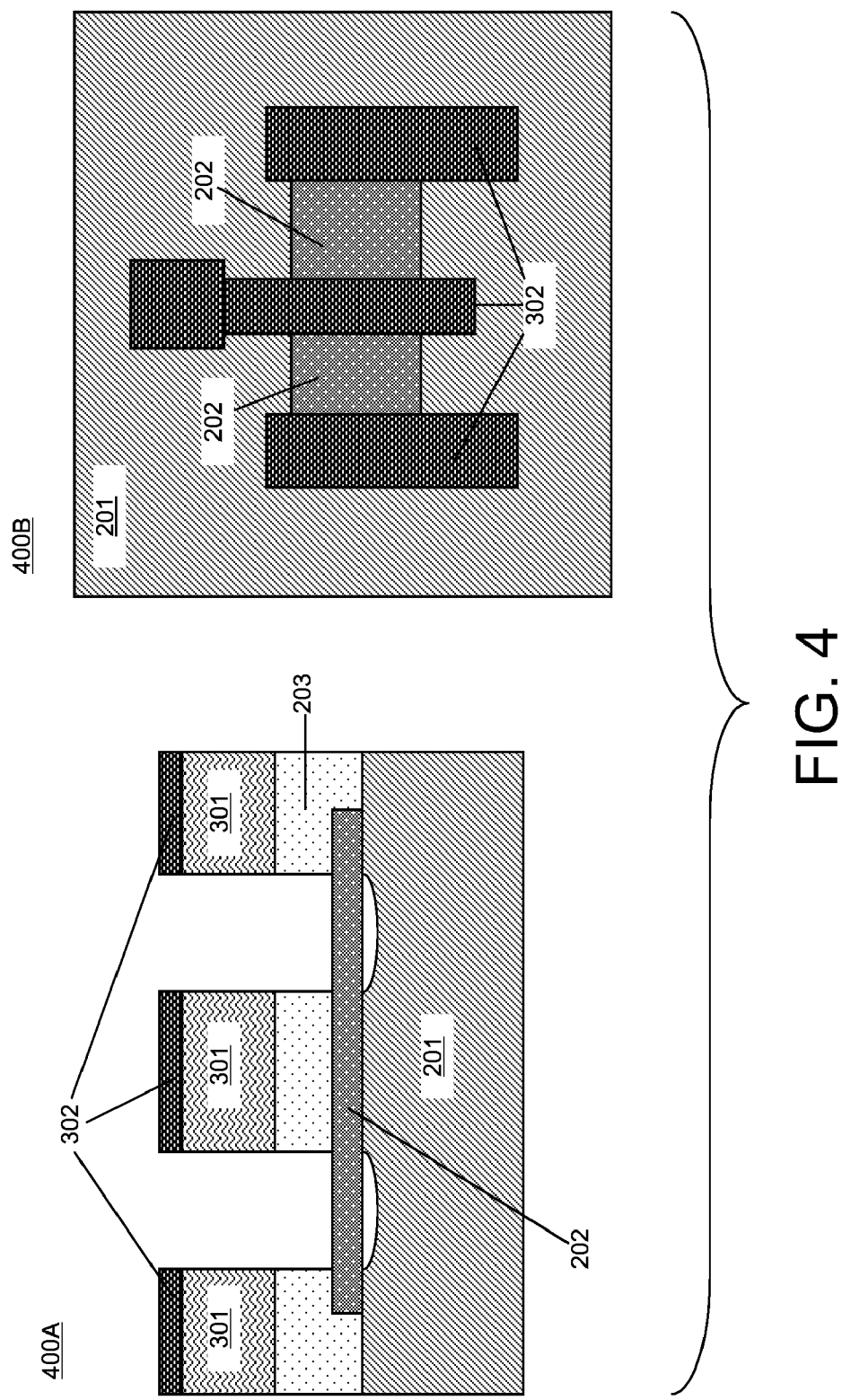
FIG. 4 illustrates an embodiment of a cross section and a top view of the device of FIG. 3 after etching the first dielectric.

In block 103, a high k etch is used to remove the exposed portion of first dielectric layer 203 (the portion not located underneath gate metal 301 and nitride layers 302), thereby exposing substrate 201 and a portion of carbon layer 202, as shown in FIG. 4. FIG. 4 illustrates an embodiment of a cross section 400A and a top view 400B of the device of FIG. 3 after high k etching. The nitride layers 302 act as a hard mask during the high k etch. In embodiments in which carbon layer 202 comprises carbon nanotubes, the high k etch of block 103 may overetch into the substrate 201 underneath carbon layer 202, as shown in cross section 400A. In other embodiments, in which carbon layer 202 comprises one or more sheets of graphene, the high k etch of block 103 may stop at carbon layer 202, and not overetch into substrate 201. The high k etch may comprise a wet etch, which may be selected so as not to damage carbon layer 202.

Figure 5:
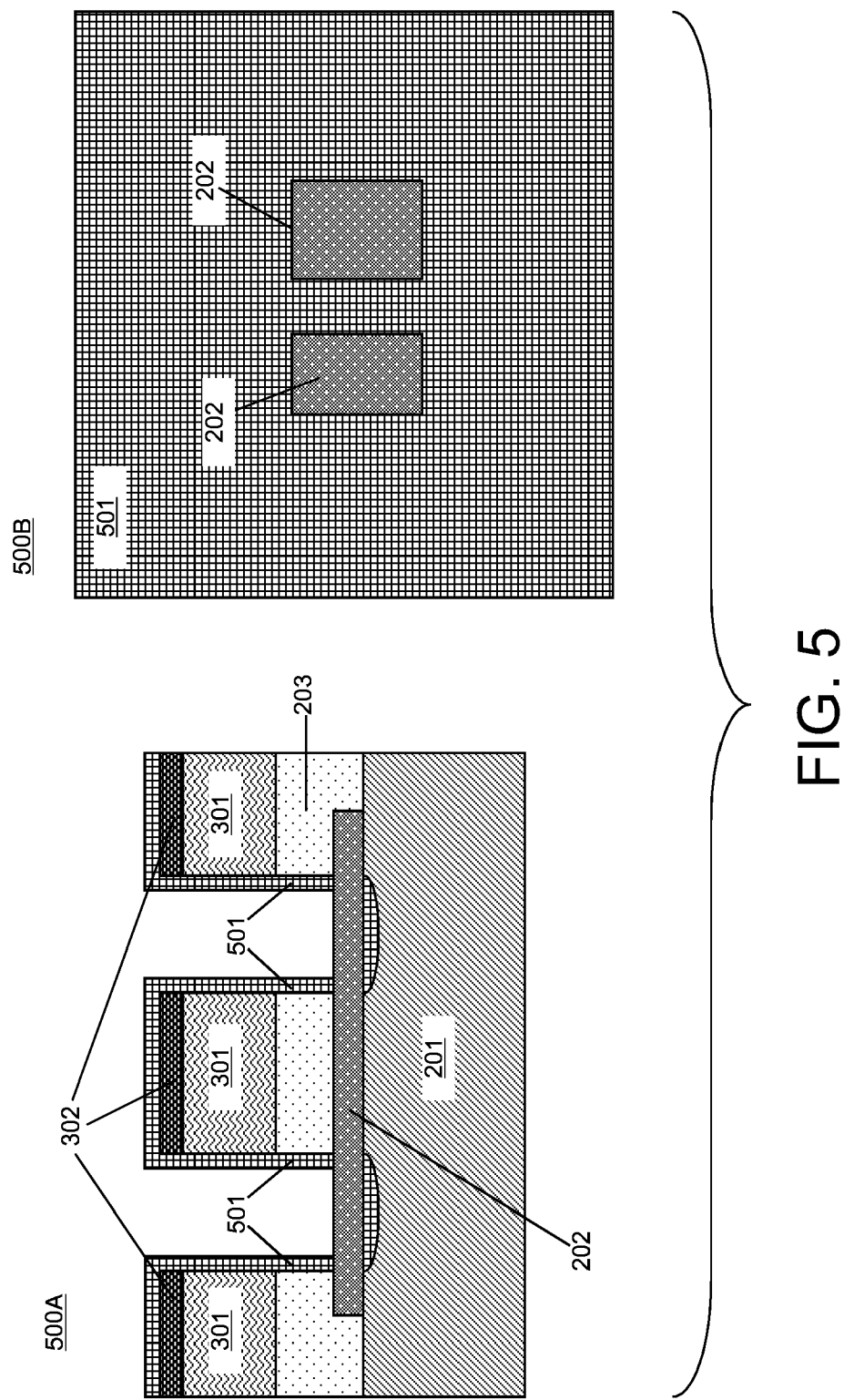
FIG. 5 illustrates an embodiment of a cross section and a top view of the device of FIG. 4 after atomic layer deposition of a second dielectric.

In block 104, a second dielectric 501 is deposited using ALD over the device of FIG. 4, as shown in FIG. 5. FIG. 5 illustrates an embodiment of a cross section 500A and a top view 500B of the device of FIG. 4 after deposition of the second dielectric 501. The second dielectric 501 is formed using ALD with no seed layer; therefore, second dielectric 501 does not form on carbon layer 202, but will form good coverage on nitride layers 302, gate metal 301, first dielectric 203, and substrate 201. Second dielectric 501 may also form on the overetched portion of substrate 201 located under carbon layer 202 in embodiments in which carbon layer 202 comprises carbon nanotubes. The second dielectric 501 comprises the spacer for the finished FET (discussed below with respect to FIG. 8 and block 107). Use of ALD to form the second dielectric 501 allows for precise control of the thickness of second dielectric 501, anywhere in the range of about 10 angstroms to about 100 nanometers. The second dielectric 501 may comprise a low k material in some embodiments.

Figure 6:
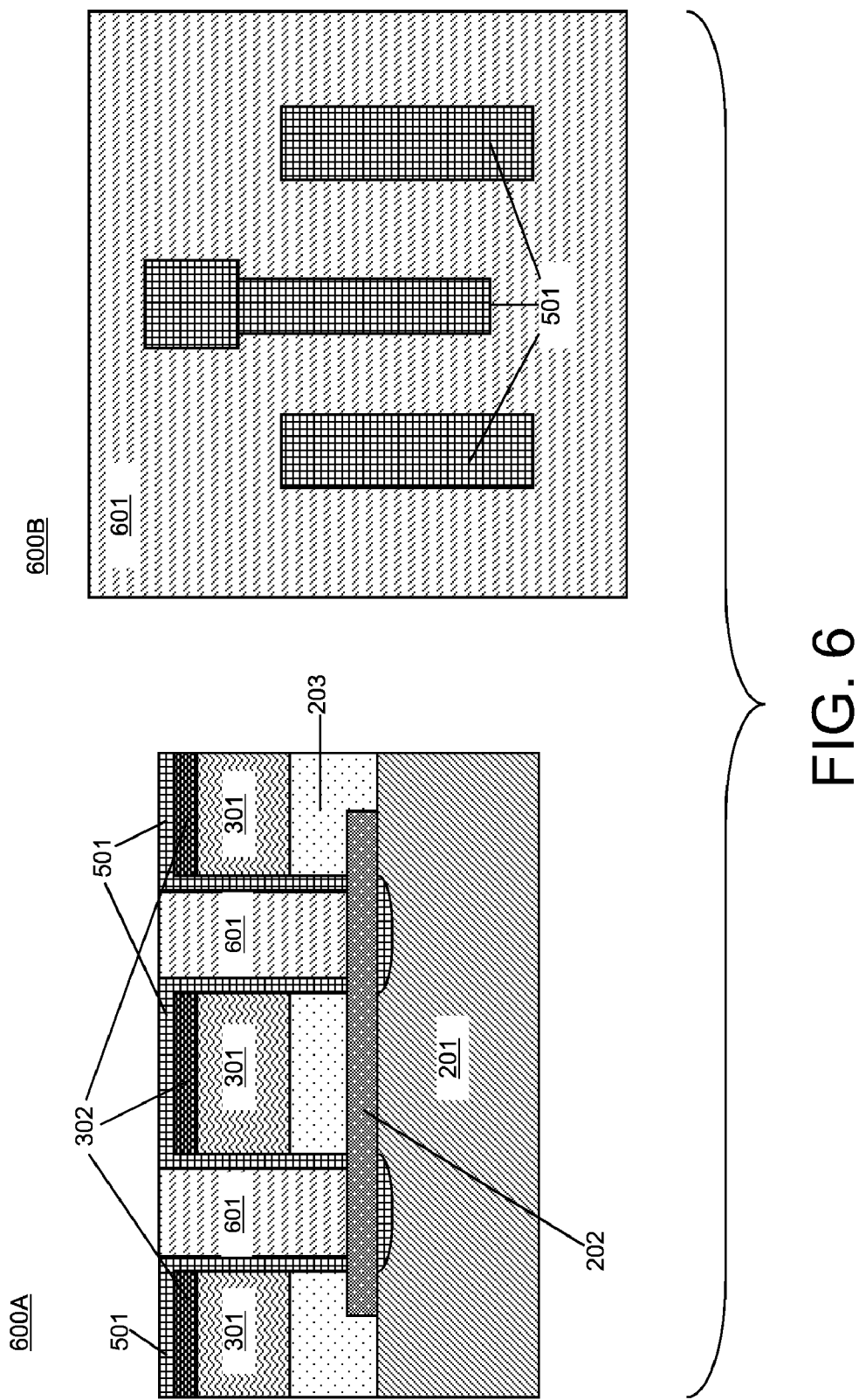
FIG. 6 illustrates an embodiment of a cross section and a top view of the device of FIG. 5 after metal deposition and chemical mechanical polishing.

In block 105, metal layer 601 is formed over the device of FIG. 5, and chemical mechanical polishing (CMP) is performed to expose the top portion of second dielectric 501 located on top of the gate electrodes on nitride layers 302. FIG. 6 illustrates an embodiment of a cross section 600A and a top view 600B of the device of FIG. 5 after deposition of metal 601 and CMP. Metal layer 601 may comprise palladium in embodiments in which a p-type carbon FET is being formed, or may comprise aluminum in embodiments in which an n-type carbon FET is being formed.

Figure 7:
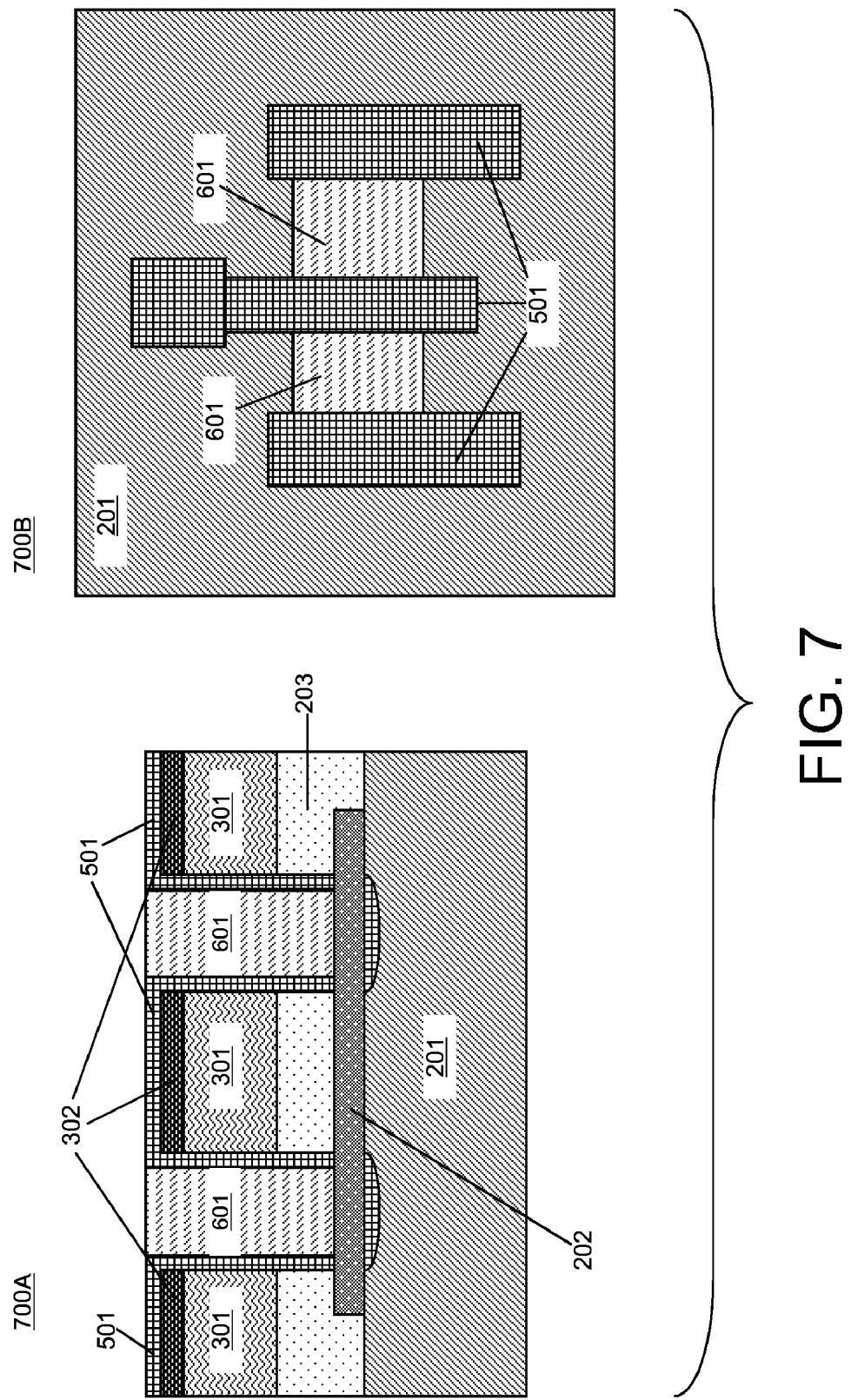
FIG. 7 illustrates an embodiment of a cross section and a top view of the device of FIG. 6 after patterning of source and drain bars.

In block 106, the metal layer 601 of the device of FIG. 6 is patterned to form source and drain bars over carbon layer 202, removing the portion of metal 601 that is located on the surface of the substrate 201, as shown in FIG. 7. FIG. 7 illustrates an embodiment of a cross section and a top view of the device of FIG. 6 after patterning of source and drain bars, which comprise the remaining portion of metal 601 located on carbon layer 202 after patterning. Patterning of metal layer 601 may be performed using a hard mask, such as oxide, or a soft mask in some embodiments. The metal 601 that comprises the source and drain bars provides an electrical connection to the source and drain regions of the finished FET, which are located in carbon layer 202.

Figure 8:
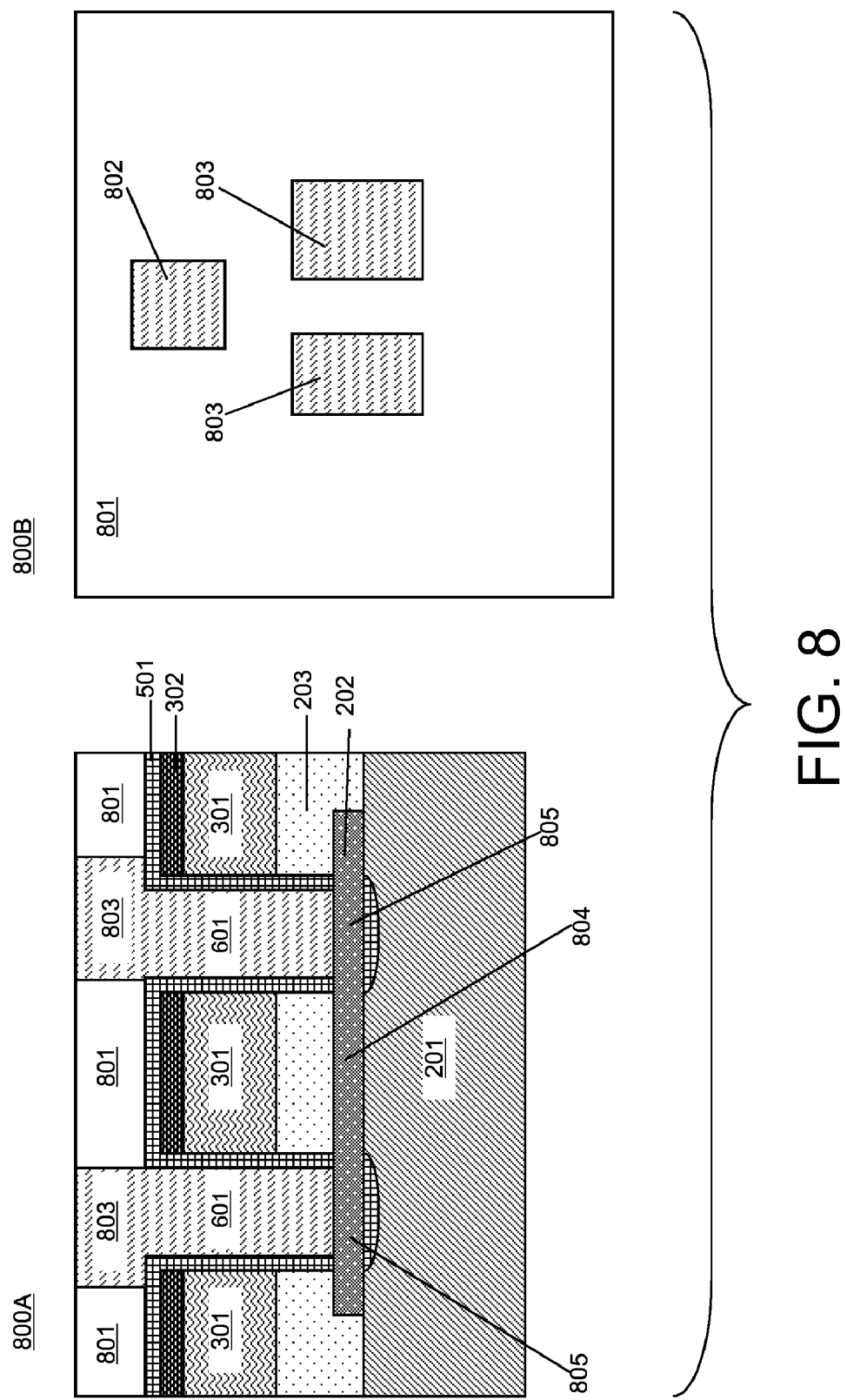
FIG. 8 illustrates an embodiment of a cross section and a top view of a carbon-based FET after formation of gate, source, and drain metal contacts and a passivation layer.

In block 107, a passivation layer 801 is formed over device 700, and metal contacts for the gate, source, and drain of the finished FET are formed, as shown in FIG. 8. FIG. 8 illustrates an embodiment of a cross section 800A and a top view 800B of a carbon FET after formation of gate, source, and drain contacts 802 and 803, and a passivation layer 801. The top gate, source, and drain contacts formed in block 107 may comprise the same metal as metal layer 601 in some embodiments. Gate contact 802 is located on top of the gate electrode comprising second dielectric 501, nitride 302, and gate metal 301, which is located on top of the first dielectric 203 and the channel region 804 of carbon layer 202. Source and drain contacts 803 are located over source and drain bars comprising metal 601, and the source/drain regions 805 of the FET, which are located in carbon layer 202. Passivation layer 801 may comprise a relatively thick layer of oxide or nitride in some embodiments. Second dielectric 501 comprises the spacer of the carbon-based FET shown in FIG. 8, and is located adjacent to and on top of the gate electrode. Because second dielectric 501 is deposited using ALD in block 104, the thickness of the spacer is adjustable, and may be made as thin a necessary to minimize underlap between the gate metal 301 and the source/drain regions in carbon layer 202, thereby reducing the parasitic resistance and power consumption of the carbon-based FET.

The technical effects and benefits of exemplary embodiments include formation of a spacer for a carbon-based FET with precise thickness control, anywhere in the range from about 10 angstroms to about 100 nanometers or greater.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A carbon-based field effect transistor (FET) comprising:
a substrate;
a carbon layer located on the substrate, the carbon layer comprising a channel region, and source and drain regions located on either side of the channel region;
a gate electrode located on the channel region in the carbon layer, the gate electrode comprising a first dielectric layer, a gate metal layer located on the first dielectric layer, and a nitride layer located on the gate metal layer; and
a spacer comprising a second dielectric layer located adjacent to the gate electrode, wherein the spacer is not located on the carbon layer.

2. The carbon-based FET of claim 1, wherein the carbon layer comprises a carbon nanotube.

3. The carbon-based FET of claim 1, wherein the carbon layer comprises one or more sheets of graphene.

4. The carbon-based FET of claim 1, wherein the spacer comprises a low k material.

5. The carbon-based FET of claim 1, wherein the spacer comprises a material deposited by atomic layer deposition (ALD).

6. The carbon-based FET of claim 1, wherein the gate metal layer comprises palladium, and the carbon-based FET comprises a p-type FET.

7. The carbon-based FET of claim 1, wherein the gate metal layer comprises aluminum, and the carbon-based FET comprises an n-type FET.

8. The carbon-based FET of claim 1, further comprising a metal contact to one of the source and drain regions in the carbon layer, wherein a first portion of the metal contact is located on the carbon layer.

9. The carbon-based FET of claim 8, wherein a second portion of the metal contact is located on the spacer.

10. The carbon-based FET of claim 1, further comprising a gate metal contact to the gate electrode.

11. The carbon-based FET of claim 1, further comprising a passivation layer comprising one of oxide and nitride located over the carbon-based FET.

12. The carbon-based FET of claim 1, wherein the first dielectric layer comprises a high k material.

13. The carbon-based FET of claim 1, wherein the first dielectric layer is formed by ALD using an ozone treatment on the carbon layer.

14. The carbon-based FET of claim 1, wherein the first dielectric layer is formed by ALD using a seed layer on the carbon layer.

15. The carbon-based FET of claim 1, wherein the spacer extends into the substrate below the carbon layer.

16. The carbon-based FET of claim 1, wherein the spacer is located on the substrate underneath the carbon layer.

* * * * *